(12) United States Patent
Convert et al.

(10) Patent No.: US 9,571,035 B1
(45) Date of Patent: Feb. 14, 2017

(54) ALTERNATING ANTI-PARALLEL DIODE MIXER STRUCTURE

(71) Applicant: MACOM Technology Solutions Holdings, Inc., Lowell, MA (US)

(72) Inventors: Emmanuelle R. O. Convert, Cammeray (AU); Simon J. Mahon, Avalon (AU); James T. Harvey, Rushcutters Bay (AU)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/044,407

(22) Filed: Feb. 16, 2016

(51) Int. Cl.
*H04B 1/26* (2006.01)
*G06F 7/44* (2006.01)
*H03D 7/14* (2006.01)
*H03H 7/01* (2006.01)

(52) U.S. Cl.
CPC .......... *H03D 7/1408* (2013.01); *H03H 7/0115* (2013.01)

(58) Field of Classification Search
CPC .. H03D 7/1458; H03D 7/1466; H03D 7/1475; H03D 7/1483; H03D 7/1491

USPC .......... 327/355–361; 455/323, 326
See application file for complete search history.

(56) References Cited

U.S. PATENT DOCUMENTS

| 3,983,489 A | * | 9/1976 | Gittinger | H03D 7/02 455/331 |
| 7,167,698 B2 | * | 1/2007 | Katz | H03D 9/0633 333/125 |
| 2005/0191985 A1 | * | 9/2005 | Bos | H04B 1/0475 455/326 |

* cited by examiner

*Primary Examiner* — Dinh T Le
(74) *Attorney, Agent, or Firm* — Christopher P. Maiorana, PC

(57) ABSTRACT

An apparatus includes a first circuit and a second circuit. The first circuit may be fabricated in a substrate and generally includes a first diode and a second diode (i) connected as anti-parallel diodes and (ii) physically adjacent to each other in the substrate. The second circuit may be fabricated in the substrate and generally includes a third diode and a fourth diode (i) connected as anti-parallel diodes and (ii) physically adjacent to each other in the substrate. The first circuit and the second circuit may be (a) connected in parallel, (b) physically adjacent to each other in the substrate and (c) configured to mix two input signals to generate an output signal.

20 Claims, 6 Drawing Sheets

ALTERNATING ANTI-PARALLEL DIODE MIXER STRUCTURE

FIELD OF THE INVENTION

The present invention relates to mixers generally and, more particularly, to a method and/or apparatus for implementing an alternating anti-parallel diode mixer structure.

BACKGROUND OF THE INVENTION

Reduction of radiated spurious signals is a criterion of modern communication receivers and transmitters, particularly in low and zero intermediate frequency architectures that facilitate decreased equipment costs. In such radios, a local oscillator leakage cannot be removed by radio frequency filters. A local oscillator to radio frequency isolation of a mixer used to shift the radio frequency to or from an intermediate frequency becomes important.

Regulatory bodies specify tight criteria for spurious radiation. A general specification for receivers by the European Committee for Standardization and Communications (ETSI) limits the leakage of local oscillator radiation to −55 decibel-milliwatts (dBm) to avoid interference to nearby receivers. The performance criterion of low and zero intermediate frequency receivers dictates even lower levels of spurious radiation. Radiated spectral mask specifications also impose a high local oscillator to radio frequency isolation in low and zero intermediate frequency transmitters.

Conventional mixers use a fundamental local oscillator signal to heterodyne the radio frequency to or from the intermediate frequency. The specified isolation of the high-level local oscillator is difficult to achieve due to a dependency on a balance of transformers. An alternative architecture is a sub-harmonic mixer that uses antiparallel diodes to implement a mixer where the high level local oscillator signal is an even sub-harmonic of the radio frequency.

It would be desirable to implement an alternating anti-parallel diode mixer structure.

SUMMARY OF THE INVENTION

The present invention concerns an apparatus that includes a first circuit and a second circuit. The first circuit may be fabricated in a substrate and generally includes a first diode and a second diode (i) connected as anti-parallel diodes and (ii) physically adjacent to each other in the substrate. The second circuit may be fabricated in the substrate and generally includes a third diode and a fourth diode (i) connected as anti-parallel diodes and (ii) physically adjacent to each other in the substrate. The first circuit and the second circuit may be (a) connected in parallel, (b) physically adjacent to each other in the substrate and (c) configured to mix two input signals to generate an output signal.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the present invention include providing an alternating anti-parallel diode mixer structure that may (i) provide better local oscillator signal leakage than common lumped anti-parallel designs, (ii) provide better local oscillator signal leakage than resistive-based designs, (iii) reduce the creation of local oscillator second harmonics, (iv) provide an improved thermal balance, (v) provide an improved radio frequency balance, (vi) implement frequency down conversions, (vii) implement frequency up conversions and/or (viii) be implemented in a single integrated circuit.

Various embodiments of the present invention may provide an anti-parallel diode mixer structure in which each alternating (every-other) diode finger has an opposite polarity than the diodes to either side. Each diode finger generally has a cathode connected to anodes of one or more immediately neighboring diodes and an anode connected to the cathodes of one or more immediately neighboring diodes in an anti-parallel diode arrangement. The alternating (or interdigitated) layout generally reduces a creation of local oscillator even harmonics that may be effective fundamental harmonics in a radio system sense. The anti-parallel diode structure may be sub-harmonically pumped to reduce or avoid creation of the local oscillator even harmonics.

The interdigitated layout of the diodes may be analogous to a 0101 . . . alternating sequence of binary bits. The zero-value bits may present the diodes having a particular layout in one direction. The one-value bits may present the diodes having a layout in the opposite direction. The alternating layout generally provides better radio frequency balance and thermal balance than common lumped diode layouts. The alternating layout may also reduce a fundamental local oscillator leakage for a core mixer cell (e.g., by up to 30 decibels (dB)).

The alternating anti-parallel diode structure may be implemented in mixers. The mixers may be used in frequency up-converters and/or in frequency down-converters. In up-converter mixers, an improved current drive of the mixers may reduce radio costs by enabling direct up conversion (heterodyne) architectures, also known as zero intermediate frequency architectures. Other applications of the frequency mixer may be implemented to meet the design criteria of a particular application.

Figure 1:
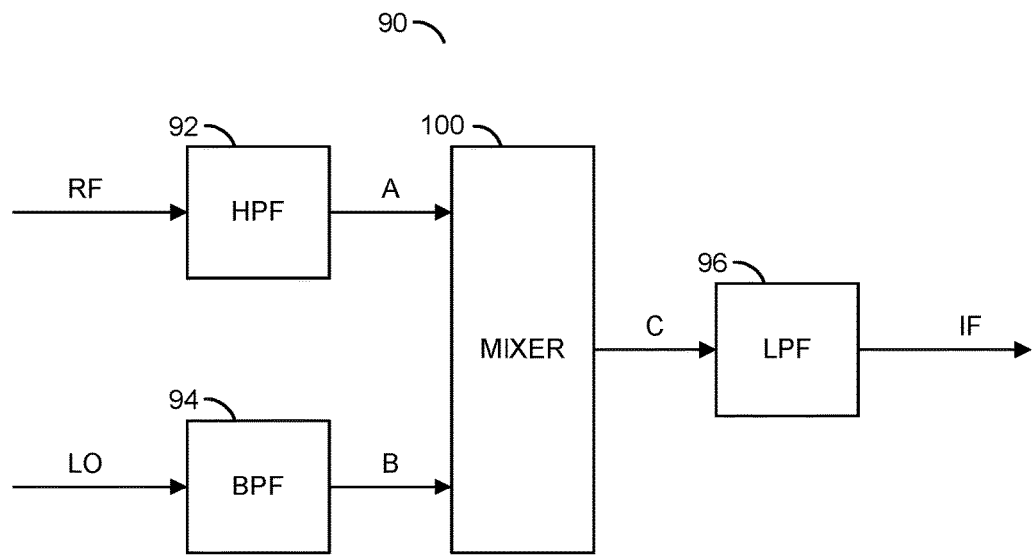
FIG. 1 is a block diagram of a converter circuit.

Referring to FIG. 1, a block diagram of an example implementation of a circuit 90 is shown. The circuit 90 may be operational as a down-converter circuit. The circuit 90 generally comprises a block (or circuit) 92, a block (or circuit) 94, a block (or circuit) 96 and a block (or circuit) 100. The circuits 92-100 may be implemented with hardware and/or simulated with software.

A signal (e.g., RF) may be received by the circuit 92. The signal RF may be a radio frequency signal received by the circuit 90. In various embodiments, the signal RF may reside within an extremely high frequency band (e.g., 30 gigahertz (GHz) to 300 GHz). The signal RF may be implemented in other frequency bands to meet the design criteria of a particular application.

The circuit 92 may generate a signal (e.g., A) transferred to the circuit 100. The signal A may represent a filtered version of the signal RF. A signal (e.g., LO) may be received by the circuit 94. The signal LO may be a local oscillator signal generated internally to the circuit 90. The circuit 94 may generate a signal (e.g., B) transferred to the circuit 100. The signal B may represent a filtered version of the signal LO. A signal (e.g., C) may be generated by the circuit 100 and conveyed to the circuit 96. The signal C may be implemented as an intermediate frequency signal. A frequency of the signal C may be based on the frequencies in the signals RF and LO. The circuit 96 may generate and present a signal (e.g., IF). The signal IF may be a filtered version of the signal C. In various embodiments, the signal RF may have a fundamental frequency higher than the signal LO. In some embodiments, the signal LO may have a higher fundamental frequency than the signal IF.

The circuit 92 is shown implemented as high-pass filter (HPF) circuit. The HPF circuit 92 is generally operational to high-pass filter the signal RF to create the signal A. A cut-off frequency of the HPF circuit 92 may allow fundamental and higher frequencies of the signal RF to pass with little to no attenuation and attenuate frequencies lower than the fundamental frequency of the signal RF.

The circuit 94 is shown implemented as a band-pass filter (BPF) circuit. The BPF circuit 92 is generally operational to band-pass filter the signal LO to create the signal B. The filter characteristics of the BPF circuit 94 may allow the fundamental frequency of the signal LO to pass through with little to no attenuation and attenuate frequencies above and below the fundamental frequency of the signal LO.

The circuit 96 is shown implemented as a low-pass filter (LPF) circuit. The LPF circuit 96 is generally operational to low-pass filter the signal C to create the signal IF. A cut-off frequency of the LPF circuit 96 may allow the fundamental and lower frequencies of the signal C to pass with little to no attenuation and attenuate frequencies higher than the fundamental frequency in the signal C. Other configurations of the filter circuits 92, 94 and/or 96 may be implemented to meet the design criteria of a particular application.

The circuit 100 is shown implemented as a mixer circuit. In various embodiments, the circuit 100 may be implemented as a sub-harmonic mixer circuit. The mixer circuit 100 is generally operational to mix the signals A and B to generate the signal C. In some embodiments, the mixing of the signals A and B may be achieved with anti-parallel diodes. The anti-parallel diodes may be fabricated on a semiconductor substrate in an alternating pattern where the cathodes and anodes of every other diode are oriented in opposing directions. In a down-conversion mode, the signal IF may be related to the signals RF and LO by equation 1 as follows:

$$IF = 2 \times N \times LO \pm M \times RF, \qquad (1)$$

where N and M may be integers and the frequencies of the signals may have values such that IF<LO and IF<RF. Generally, the output signal IF may have a lower frequency than both of the two input signals RF and LO.

Figure 2:
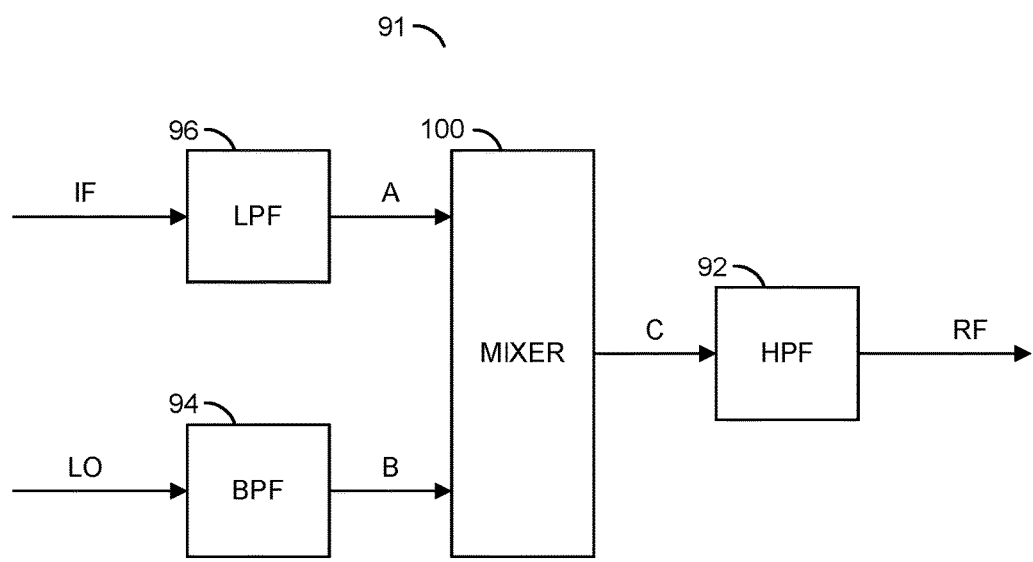
FIG. 2 is a block diagram of another converter circuit.

Referring to FIG. 2, a block diagram of an example implementation of a circuit 91 is shown. The circuit 91 may be operational as an up-converter circuit. The circuit 91 generally comprises the circuit 92, the circuit 94, the circuit 96 and the circuit 100. The circuit 92 may receive the signal C and generate the signal RF. The circuit 94 may receive the signal LO and generate the signal B. The circuit 96 may receive the signal IF and generate the signal A.

The HPF circuit 92 is generally operational to high-pass filter the signal C to create the signal RF. A cut-off frequency of the HPF circuit 92 may allow fundamental and higher frequencies of the signal C to pass with little to no attenuation and attenuate frequencies lower than the fundamental frequency of the signal C.

The BPF circuit 94 is generally operational to band-pass filter the signal LO to create the signal B. The filter characteristics of the BPF circuit 94 may allow the fundamental frequency of the signal LO to pass through with little to no attenuation and attenuate frequencies above and below the fundamental frequency of the signal LO.

The LPF circuit 96 is generally operational to low-pass filter the signal IF to create the signal A. A cut-off frequency of the LPF circuit 96 may allow the fundamental and lower frequencies of the signal IF to pass with little to no attenuation and attenuate frequencies higher than the fundamental frequency in the signal IF.

In an up-conversion mode, the circuit 100 may relate the signal RF to the signals IF and LO by equation 2 as follows:

$$RF = 2 \times N \times LO \pm M \times IF, \qquad (2)$$

where N and M may be integers and the frequencies of the signals may have values such that IF<LO and IF<RF. Generally, the output signal RF may have a higher frequency than both of the two input signals IF and LO.

Figure 3:
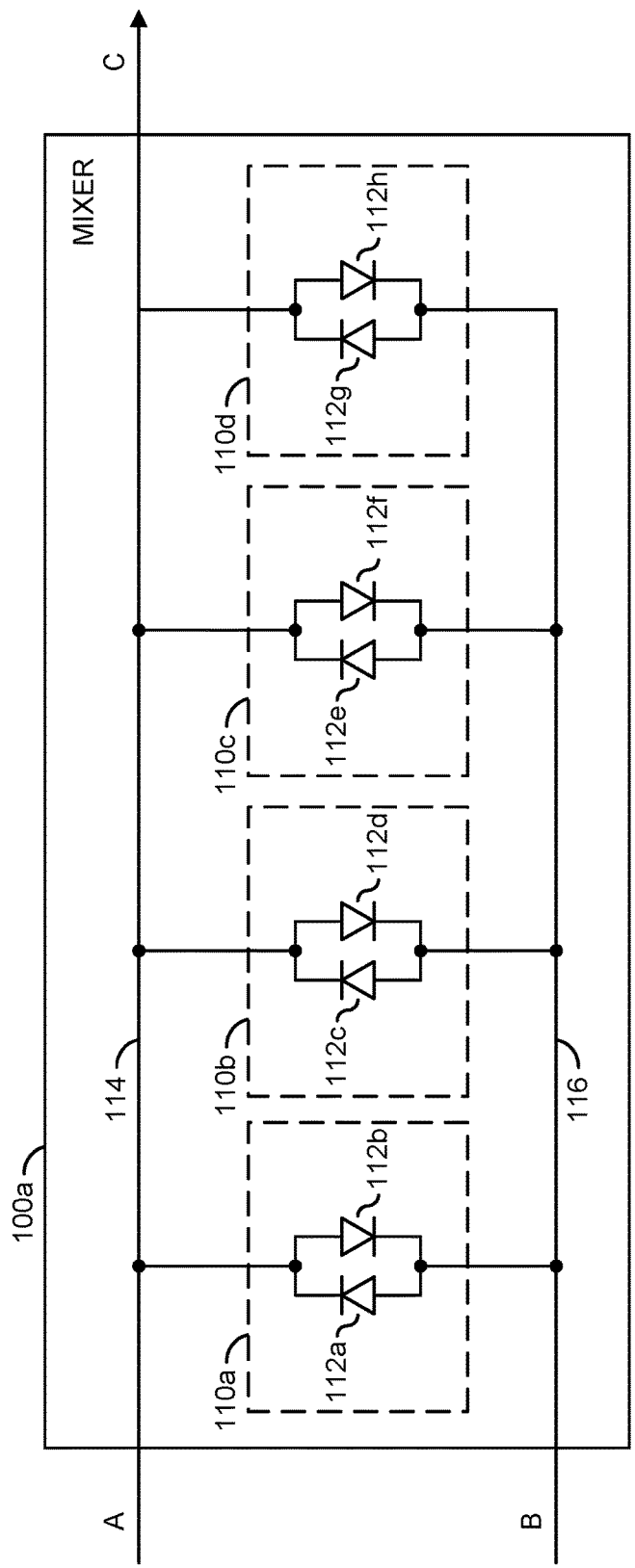
FIG. 3 is a block diagram of a series mixer circuit.

Referring to FIG. 3, a block diagram of an example implementation of a series mixer circuit 100a is shown. The mixer circuit 100 may be implemented with the series mixer circuit 100a. The circuit 100a generally comprises multiple blocks (or circuits) 110a-110d. The circuit 110a-110d generally comprises multiple blocks (or circuits) 112a-112h. Each circuit 110a-110d may include two of the circuits 112a-112h configured in an anti-parallel arrangement. A trace (or wire) 114 may connect an end of each circuit 110a-110d. A trace (or wire) 116 may connect another end of each circuit 110a-110d opposite the trace 114. The circuits 110a-116 may be implemented with hardware and/or simulated with software.

The signal A may be received on the trace 114. The signal B may be received on the trace 116. The signal C may be generated and presented from the trace 114. Each circuit 110a-110d may implement an anti-parallel diode circuit. Each circuit 112a-112h may be implemented as a diode. A series arrangement may be provided in which the trace 114 is connected in series to the diode circuits 110a-110d, and the diode circuits 110a-110d are connected in series to the trace 116. The circuits 110a-110d may be connected in parallel with respect to each other.

Each circuit 110a-110d is shown implemented as a diode circuit with a respective pair of the diodes 112a-112h. In various embodiments, the circuit 110a may include the diodes 112a and 112b. The circuit 110b may include the diodes 112c and 112d. The circuit 110c may include the diodes 112e and 112f. The circuit 110d may include the diodes 112g and 112h. Other numbers (or amounts) of the diode circuits 110a-110d may be implemented to meet the design criteria of a particular application. Other numbers (or amounts) of diodes within each diode circuit 110a-110d may be implemented to meet the design criteria of a particular application.

The diodes in each circuit 110a-110d may be arranged in an anti-parallel format. For example, the cathode of the diode 112a may be connected to the anode of the diode 112b. The cathode of the diode 112b may be connected to the anode of the diode 112a. Similar connections may be made between the diode pairs 112c-112d, 112e-112f and 112g-112h.

Figure 4:
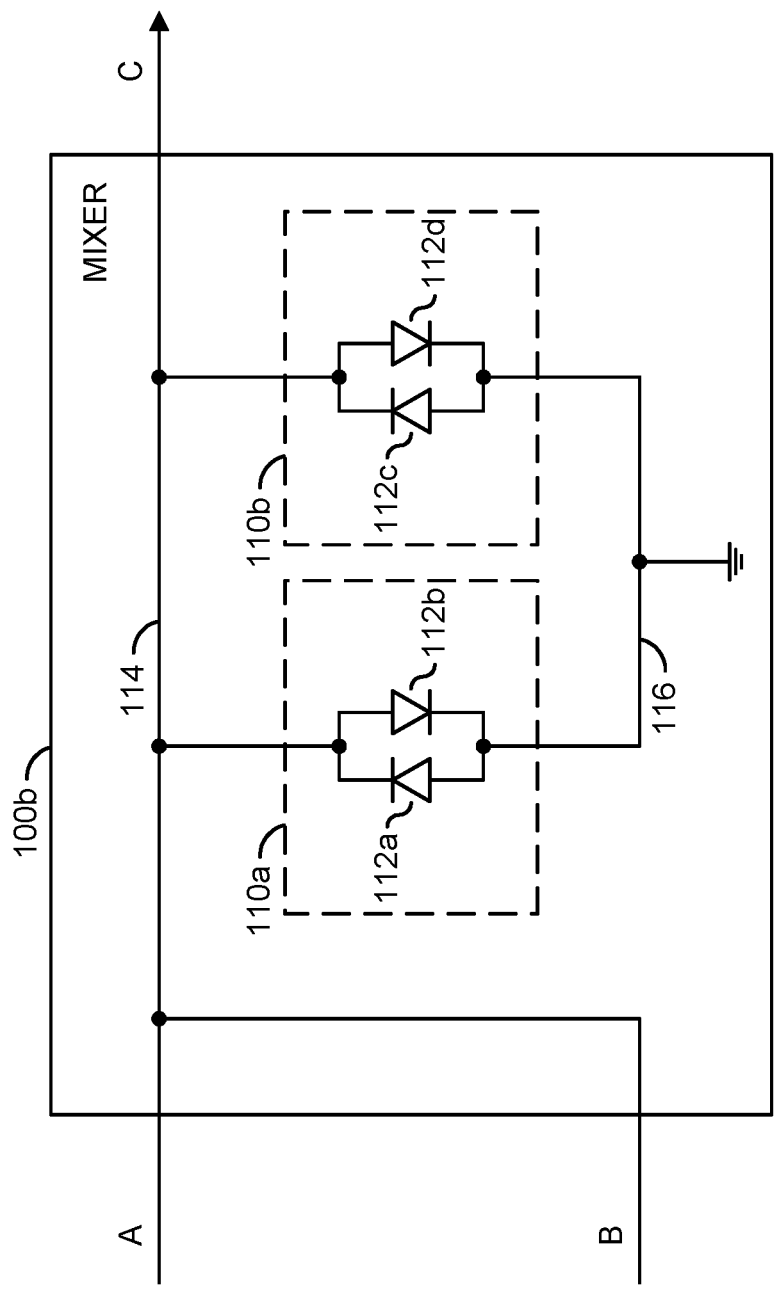
FIG. 4 is a block diagram of a shunt mixer circuit.

Referring to FIG. 4, a block diagram of an example implementation of a shunt mixer circuit 100b is shown. The mixer circuit 100 may be implemented with the shunt mixer circuit 100b. The circuit 100b generally comprises the diode circuits 110a-110b. The trace 114 may connect an end of each diode circuit 110a-110b. The trace 116 may connect another end of each diode circuit 110a-110b opposite the trace 114. In various embodiments, additional anti-parallel diode circuits may be incorporated in the shunt mixer circuit 110b as illustrated in the series mixer circuit 100a as shown in FIG. 3.

The signal A may be received on the trace 114. The signal B may be received on the trace 114. The signal C may be generated and presented from the trace 114. The trace 116 may be connected to a signal ground. A shunt arrangement may be provided by the diode circuits 110a-110b that shunt the trace 114 to ground through the trace 116. The diode circuits 110a-110b may be connected in parallel with respect to each other.

Figure 5:
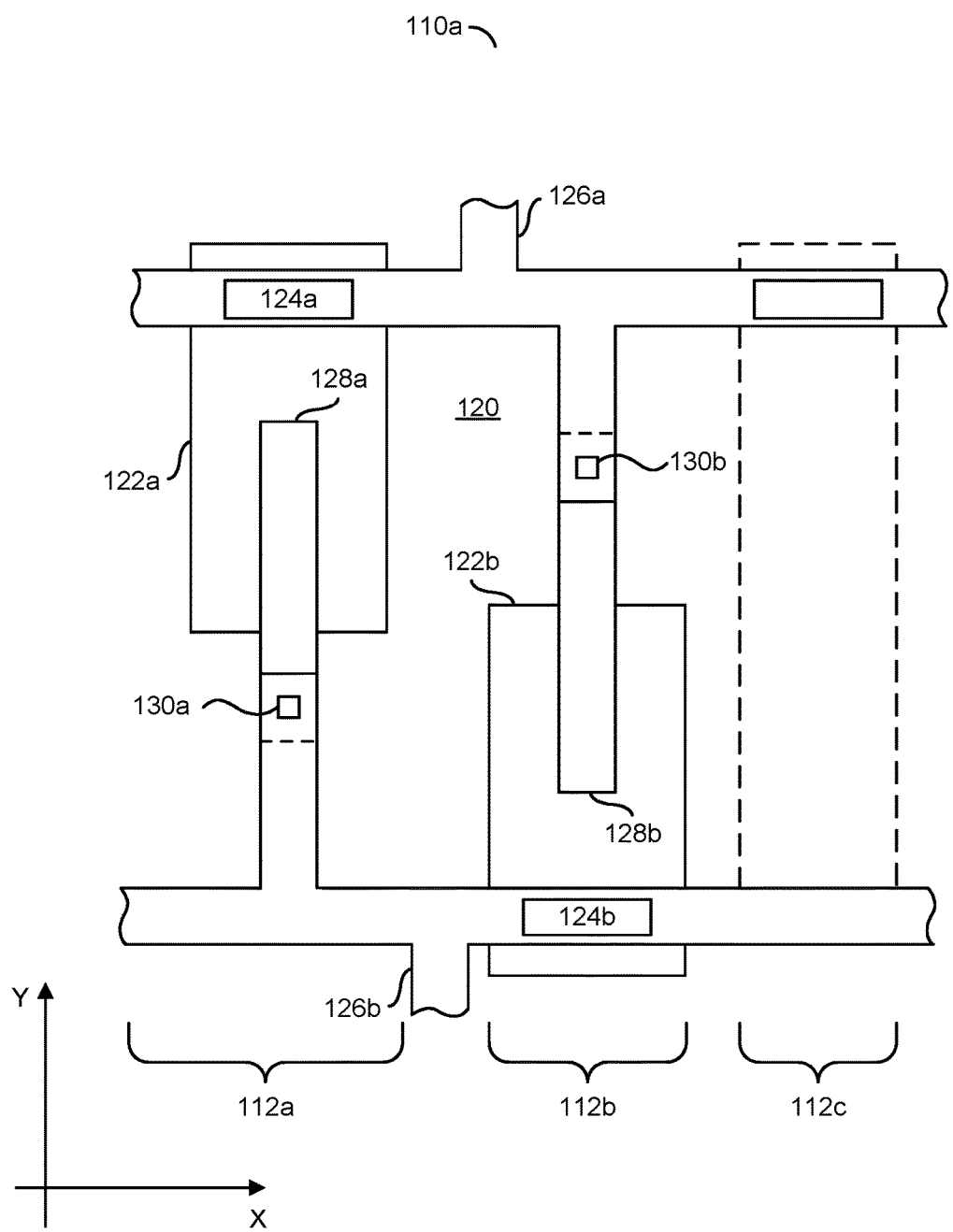
FIG. 5 is a layout of a mixer circuit in accordance with a preferred embodiment of the present invention.

Referring to FIG. 5, a layout of an example layout of the diode circuit 110a is shown in accordance with a preferred embodiment of the present invention. A layout of the other diode circuits 110b-110d may be similar to that of diode circuit 110a. The diode circuit 110a, and the other diode circuits 110b-110d, may be fabricated in a substrate 120 comprising one or more semiconductors. A layout of the diode circuit 110a generally places the diodes 112a-112b immediately adjacent to each other.

An advantage of the layout illustrated in FIG. 5 may be a thermal balancing between the diodes 112a-112b. A change in temperature in the diode 112a is generally associated with a similar change in temperature in the other diode 112b. Other advantages of the close neighboring layout may include, but are not limited to, signal balancing between the diodes 112a-112b, process similarities between the diodes 112a-112b and/or progressive dimensional variations across the substrate 120.

In some embodiments, the diode circuit 110a may be fabricated in single-element semiconductor, such as silicon. In various embodiments, the circuit 110a may be fabricated in III-V compounds. The III-V compounds may include, but are not limited to, Gallium Arsenide (e.g., GaAs), Indium Phosphide (e.g., InP), etc. In various embodiments, three-compound semiconductors may be used to implement the diode circuit 110a. The three-compound semiconductors may include, but are not limited to Aluminum Gallium Arsenide, etc. In some embodiments, the diode circuit 110a may be fabricated in a Silicon Germanium (e.g., SiGe) compound. In other embodiments, the circuit 110a may be fabricated in a Gallium Nitride (e.g., GaN) compound. Other materials may be used to create the diode circuit 110a to meet the design criteria of a particular application.

A pair of diffusions 122a-122b may be formed in a semiconductor substrate 120, a respective diffusion for each diode 112a-112b. The diffusions 122a and 122b may be adjacent to each other along an axis (e.g., an X axis). An ohmic contact 124a may be created between the diffusion 122a and a trace 126a. An ohmic contact 124b may be created between the diffusion 122b and a trace 126b.

A conductive region 128a may overlap and contact the diffusion 122a. The contacting overlap area generally forms a diode junction between the conductive region 128a and the diffusion 122a. A conductive region 128b may overlap and contact the diffusion 122b. The contacting overlap area generally forms a diode junction between the conductive region 128b and the diffusion 122b. The conductive regions 128a-128b may be spaced from the respective ohmic contacts 124a-124b along another axis (e.g., Y axis).

An ohmic contact 130a may optionally connect the conductive region 128a to the trace 126b. An ohmic contact 130b may optionally connect the conductive region 128b to the trace 126a. In various embodiments, the conductive regions 128a-128b may be metal so the diode junctions may be Schottky diode junctions and the ohmic contacts 130a and 130b may be eliminated. In some embodiments, the conductive regions 128a-128b may be a semiconductor so the diode junctions may be PN diode junctions. Other types of diode junctions may be implemented to meet the criteria of a particular application. In various embodiments, the trace 126a may be directly connected to the trace 114 and the trace 126b may be directly connected to the trace 116.

Layouts for the mixer circuits 100, 100a and/or 100b generally organize the diode circuits 110a-110d immediately adjacent to each other along the X axis. In various embodiments, the diode circuit 110b may be placed next to the diode circuit 110a (to the right of the diode circuit 110a in FIG. 5) and oriented such that the diode 112c has the same physical orientation along the Y axis as the diode 112a and is next to the diodes 112b along the X axis. Likewise, the diode circuit 110c may be positioned next to the diode circuit 110b such that the diode 112e has the same orientation as the diodes 112a and 112c, and is next to the diode 112d. The pattern may continue for the layout of additional diode circuits 110a-110d. Once all of the diode circuits 110a-110d have been placed, every other diode 112a, 112c, . . . , 112g may be oriented physically and electrically in one direction while the other diodes 112b, 112d, . . . , 112h are oriented physically and electrically in an opposite direction.

In various embodiments, the diodes 112a-112d may be arranged in parallel and anti-parallel with respect to each other. The parallel/anti-parallel arrangement may be suited to electron beam lithography on semiconductor systems (e.g., Gallium Arsenide). In other embodiments, the diodes 112a-112d may be arranged orthogonally and anti-parallel with respect to each other. The orthogonal/anti-parallel arrangements may be suitable for optical lithography on other semiconductor systems (e.g., Silicon, Silicon Germanium or Gallium Nitride).

Figure 6:
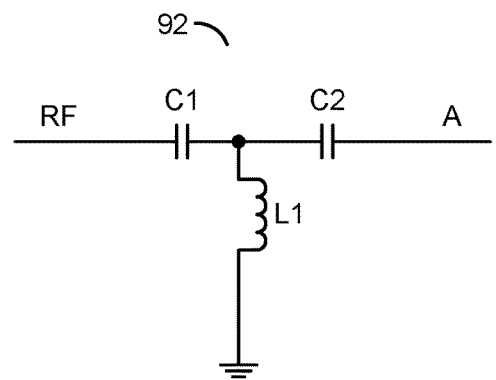
FIG. 6 is a schematic of a high-pass filter circuit.

Referring to FIG. 6, a schematic of an example implementation of the HPF circuit 92 as implemented in the circuit 90 is shown. The HPF circuit 92 generally comprises multiple capacitors C1-C2 and an inductor L1 arranged in a tee-configuration. The capacitors C1 and C2 may be connected in series. The capacitor C1 may have an end configured to receive the signal RF. The capacitor C2 may have an end configured to present the signal A. The inductor L1 may be connected between the signal ground and a junction that connects the capacitors C1 and C2.

Figure 7:
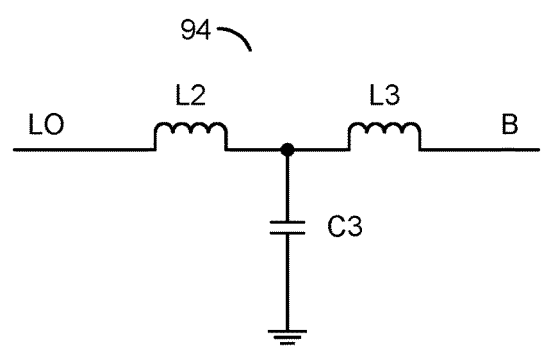
FIG. 7 is a schematic of a band-pass filter circuit.

Referring to FIG. 7, a schematic of an example implementation of the BPF circuit 94 as implemented in the circuit 90 is shown. The BPF circuit 94 generally comprises a capacitor C3 and multiple inductors L2-L3 arranged in a tee-configuration. The signal LO may be received by an end of the inductor L2. An end of the inductor L3 may present the signal B. The capacitor C3 may connect a junction that connects the inductors L2 and L3 to the signal ground.

Figure 8:
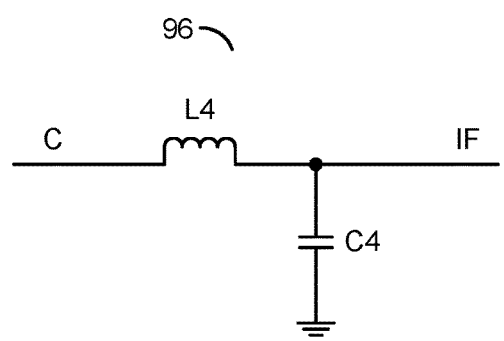
FIG. 8 is a schematic of a low-pass filter circuit.

Referring to FIG. 8, a schematic of an example implementation of the LPF circuit 96 as implemented in the circuit 90 is shown. The LPF circuit 96 generally comprises a capacitor C4 and an inductors L4 arranged in an L-configuration. The inductor L4 may have an end configured to receive the signal C. The inductor L4 may have another end configured to present the signal IF. The capacitor C4 may be connected between the signal ground and the signal IF.

Figure 9:
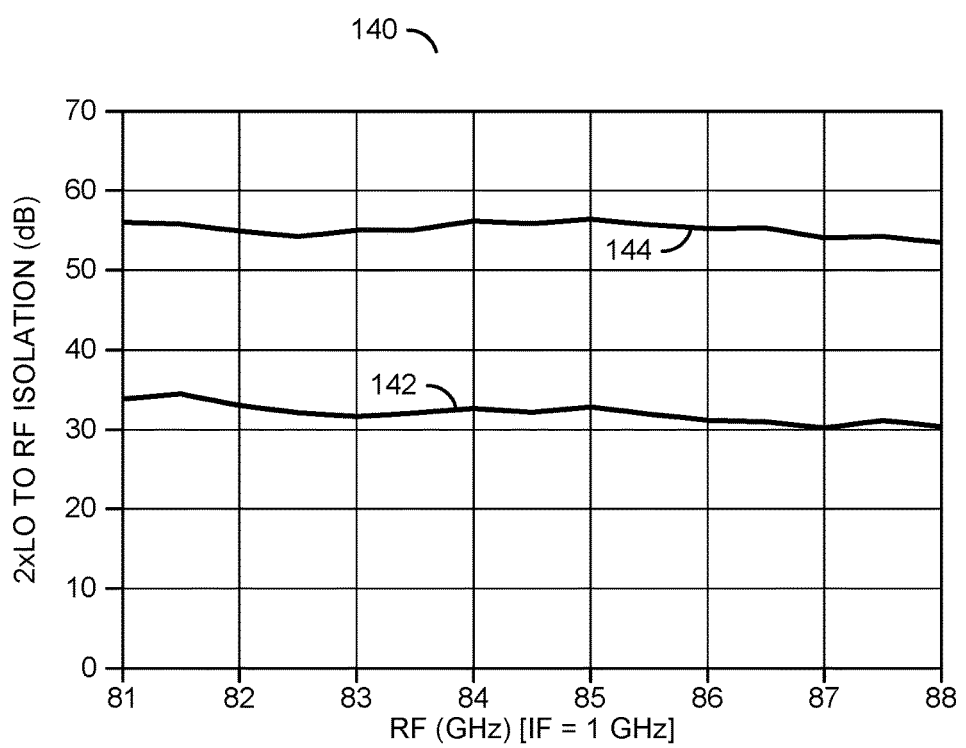
FIG. 9 is a graph of measured isolation of a radio frequency signal from a second-order harmonic in a local oscillator signal as a function of frequency.

Referring to FIG. 9, a graph 160 of measured isolation of the signal RF from a second-order harmonic in the signal LO as a function of frequency in the signal RF compared with a common diode structure is shown. The isolation is generally expressed in decibels in a range from zero dB to 70 dB. The frequency of the signal RF is generally illustrated over the range from 81 GHz to 88 GHz. The signal IF may be set at 1 GHz.

A curve 162 generally illustrates the isolation in the common series mixer having two sets of diodes. A curve 164 generally illustrates the isolation in the series mixer circuit 100a implemented with two circuits 110a-110b. The measurements generally show that the use of the alternating anti-parallel diodes 112a-112d in the circuit 110a-110b may have approximately a 20 dB to 25 dB higher isolation than the common mixer circuit. The higher isolation is generally sufficient to meet the −55 dB isolation criteria.

The functions and structures illustrated in the diagrams of FIGS. 1 to 8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit in a substrate and comprising a first diode and a second diode (i) connected as anti-parallel diodes and (ii) physically adjacent to each other in said substrate; and
a second circuit in said substrate and comprising a third diode and a fourth diode (i) connected as anti-parallel diodes and (ii) physically adjacent to each other in said substrate, wherein (A) said first circuit and said second circuit are (a) connected in parallel, (b) physically adjacent to each other in said substrate and (c) configured to mix two input signals to generate an output signal, and (B) each neighboring physical structure in said first circuit and said second circuit that forms a diode junction is physically oriented in an opposite direction along a surface of said substrate.

2. The apparatus according to claim 1, wherein (i) said two input signals comprise a radio frequency signal and a local oscillator signal and (ii) said output signal comprises an intermediate frequency signal.

3. The apparatus according to claim 1, wherein said output signal has a lower frequency than both of said two input signals.

4. The apparatus according to claim 1, wherein (i) said two input signals comprise an intermediate frequency signal and a local oscillator signal and (ii) said output signal comprises a radio frequency signal.

5. The apparatus according to claim 1, wherein said output signal has a higher frequency than both of said two input signals.

6. The apparatus according to claim 1, wherein a common spacing exists from said first diode to said second diode, from said second diode to said third diode, and from said third diode to said fourth diode.

7. The apparatus according to claim 1, wherein a first cathode of said first diode is connected to a second anode of said second diode and a first anode of said first diode connected to a second cathode of said second diode.

8. The apparatus according to claim 7, wherein a third cathode of said third diode is connected to a fourth anode of said fourth diode and a third anode of said third diode is connected to a fourth cathode of said fourth diode.

9. The apparatus according to claim 1, wherein (i) said first circuit and said second circuit are part of a sub-harmonic mixer and (ii) said output signal (OUT) is related to said two input signals (IN1 and IN2) in a down-conversion mode as $$OUT = 2 \times N \times IN1 \pm M \times IN2,$$

where N and M are harmonic integers.

10. The apparatus according to claim 1, wherein (i) said first circuit and said second circuit are part of a sub-harmonic mixer and (ii) said output signal (OUT) is related to said two input signals (IN1 and IN2) in an up-conversion mode as $$OUT = 2 \times N \times IN1 \pm M \times IN2,$$

where N and M are harmonic integers.

11. An apparatus comprising:
a plurality of filter circuits configured to filter a plurality of input signals and an output signal; and
a mixer circuit in a substrate and connected to said filter circuits, said mixer circuit comprising a plurality of diode circuits connected in parallel, and configured to mix said input signals to generate said output signal, wherein (A) each of said diode circuits (i) comprises a first diode and a second diode connected as anti-parallel diodes and (ii) is physically adjacent to at least one other of said diode circuits in said substrate, and (B) each neighboring physical structure in said mixer circuit that forms a diode junction is physically oriented in an opposite direction along a surface of said substrate.

12. The apparatus according to claim 11, wherein (i) said input signals comprise a radio frequency signal and a local oscillator signal and (ii) said output signal comprises an intermediate frequency signal.

13. The apparatus according to claim 11, wherein said output signal has a lower frequency than both of said input signals.

14. The apparatus according to claim 11, wherein (i) said input signals comprise an intermediate frequency signal and a local oscillator signal and (ii) said output signal comprises a radio frequency signal.

15. The apparatus according to claim 11, wherein said output signal has a higher frequency than both of said input signals.

16. The apparatus according to claim 11, wherein (i) a first cathode of said first diode is connected to a second anode of said second diode and (ii) a first anode of said first diode is connected to a second cathode of said second diode.

17. The apparatus according to claim 11, wherein said mixer circuit comprises a series mixer circuit electrically connected between said input signals.

18. The apparatus according to claim 11, wherein said mixer circuit comprises a shunt mixer circuit electrically connected between said input signals and a signal ground.

19. The apparatus according to claim 11, wherein a common spacing exists between each neighboring pair of said diodes in said mixer circuit.

20. The apparatus according to claim 11, wherein said mixer circuit comprises:
   a first circuit; and
   a second circuit, wherein a common spacing exists from said first diode in said first circuit to said second diode in said first circuit, from said second diode in said first circuit to said first diode in said second circuit, and from said first diode in said second circuit to said second diode in said second circuit.

* * * * *